United States Patent [19]

Sinclair

[11] 3,772,530

[45] Nov. 13, 1973

[54] THYRISTOR FIRING CIRCUIT

[75] Inventor: Walter Sinclair, Hemel Hempstead, England

[73] Assignee: Rotax Limited, Birmingham, England

[22] Filed: Mar. 1, 1972

[21] Appl. No.: 230,712

[30] Foreign Application Priority Data

Mar. 3, 1971 Great Britain .................... 5,959/71

[52] U.S. Cl. .......................... 307/252 J, 307/252 N

[51] Int. Cl. .......................................... H03k 17/72

[58] Field of Search ...................... 307/252 J, 252 N

[56] References Cited

UNITED STATES PATENTS

| | | | |
|---|---|---|---|
| 3,617,773 | 11/1971 | Eccles | 307/252 N |
| 3,335,294 | 8/1967 | Chauprade | 307/284 X |
| 3,480,797 | 11/1969 | Bedford et al. | 307/252 J |
| 3,288,261 | 11/1966 | Holseth | 307/252 J |

*Primary Examiner*—John Zazworsky
*Attorney*—John C. Holman et al.

[57] ABSTRACT

A firing circuit for a thyristor includes a resistor through which the gate of the thyristor is connected to the positive terminal of a source of supply, a diode through which the cathode of the thyristor is connected to the negative terminal of a source of supply and a switch which can be closed to ensure that the gate is negative with respect to the cathode by the voltage drop across the diode and which can be opened to connect the gate to the positive terminal of the source of supply through the resistor the collapse of current in the resistor when the switch is opened together with the self inductive effect of the resistor applying a higher voltage than the supply voltage to the gate of the thyristor thereby to ensure that the thyristor is switched on rapidly.

5 Claims, 2 Drawing Figures

THYRISTOR FIRING CIRCUIT

This invention relates to a firing circuit for a thyristor.

In order to ensure rapid switching of a thyristor which is required to deal with fast rising load currents it is essential to provide a high gate drive having a fast rise time. In addition, in order to ensure a reduction in turn off time it is necessary to ensure that the gate of the thyristor is maintained negative with respect to the cathode during turn off. This has the added benefit that the break over voltage is increased and the thyristor is more immune to random switching due to noise.

The object of the invention is to provide a firing circuit in a simple and convenient form.

A firing circuit in accordance with the invention comprises in combination, a source of d.c. supply, a resistor through which the gate of the thyristor is connected to the positive terminal of said supply, switch means closeable to connect said gate to the negative terminal of said supply, and to cause current flow through the resistor, said thyristor turning off when the anode cathode current flow through the thyristor falls to zero, and when the switch is opened the voltage applied to the gate equaling the supply voltage together with the voltage developed across the resistor due to the inductive effect of the resistor and means for determining the potential of the cathode of the thyristor so that when said switch means is closed the cathode of the thyristor will be positive with respect to the gate thereof.

Figure 1:
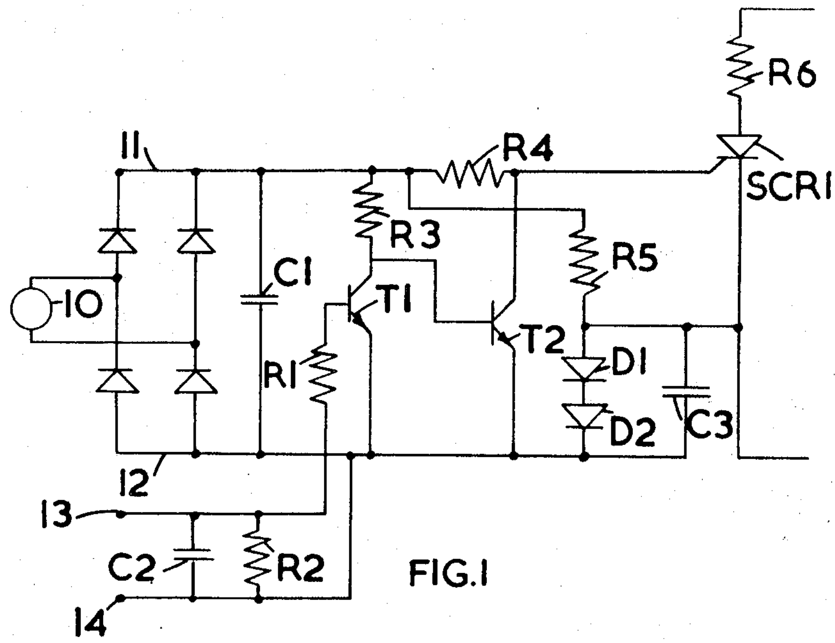
Figure 2:
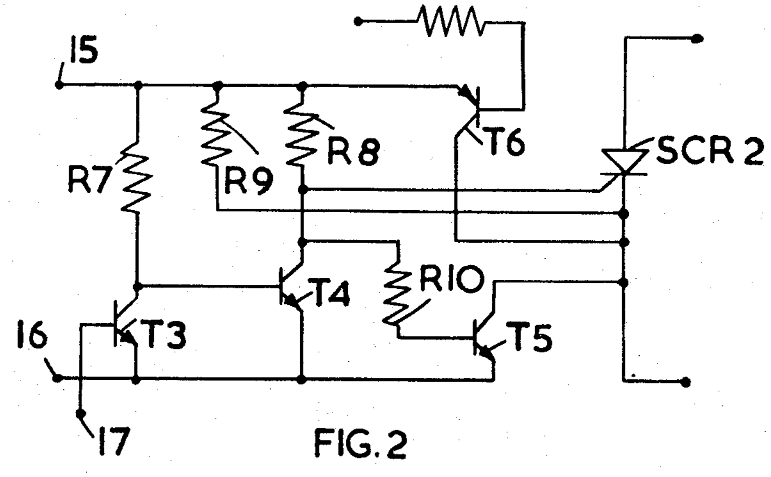

In the accompanying drawings:

FIG. 1 is a circuit diagram of one example of a firing circuit in accordance with the invention, and FIG. 2 shows a modified form of circuit.

Referring to FIG. 1 of the drawings there is provided an alternating current source 10 the output of which is rectified by means of a full wave rectifier and is applied to lines 11 and 12 which, in use, will be of positive and negative polarity respectively. Capacitor C1 is connected between the lines to effect smoothing of the rectified direct current.

FIG. 1 illustrates the provision of a thyristor SCR1 having a load represented by resistor R6 connected in the anode cathode circuit thereof. The gate of the thyristor is connected to line 11 by way of resistor R4 and the cathode of the thyristor is connected to line 12 by way of diode rectifiers D1 and D2 connected in series, the cathode of rectifier D2 being connected to line 12. Moreover, in parallel with the diode rectifiers is a capacitor C3 and the cathode of the thyristor is connected to line 11 by way of resistor R5.

There is also provided an n-p-n transistor T2 having its collector connected to the gate of the thyristor and its emitter to line 12. The base of transistor T2 is connected to the collector of n-p-n transistor T1 and to line 11 by way of resistor R3. The emitter terminal of transistor T1 is connected to line 12 and the base terminal by way of resistor R1 to an input terminal 13. A second input terminal 14 is connected directly to line 12 and connected between the terminals is a resistor R2 and a capacitor C2 connected in parallel.

In operation, assuming transistor T2 is conducting, a positive input signal supplied to terminals 13 and 14 will switch transistor T1 on and thereby transistor T2 will be switched off. In this condition drive is supplied to the gate of the thyristor by way of resistor R4 and the thyristor will be in a condition to conduct. The drive voltage initially applied to the gate is equal to the voltage of supply line 11 together with the voltage developed due to the self inductance of the resistor R4. It being appreciated that when transistor T2 is conducting current flow occurs through the resistor. When the input signal is removed transistor T1 will be turned off and transistor T2 turned on. This has the effect of connecting the gate of the thyristor to line 12. The voltage drop across the diodes D1 and D2 determines the potential of the cathode and when transistor T2 is turned on the gate of the thyristor will be negative with respect to the cathode. In this condition the thyristor will be turned off when its anode cathode current is reduced to zero and furthermore, by virtue of the fact that the gate is biased negatively with respect to the cathode and thyristor will be less susceptible to being turned on by extraneous pulses. Moreover, the thyristor break down voltage will be increased and a reduction in the turn off time will be achieved.

In some thyristor circuits pairs of thyristors are connected in series and are fired in turn to achieve reversal of current flow in a load. Whilst the control voltages applied to the thyristors may be correctly out of phase it is possible when firing one thyristor for misfiring of the other thyristor to occur due to electrical noise.

In FIG. 2 there is shown a circuit which is particularly useful in the situation described in the preceding paragraph. The circuit controls the operation of the thyristor SCR2 which is connected in series with a further thyristor not shown. The circuit includes terminals 15, 16 for connection respectively to the positive and negative terminals of a source of d.c. supply. In addition the circuit includes n-p-n transistors T3, T4, T5 each having their emitter terminals connected to terminal 16. The collector terminals of transistors T3, T4 and T5 are connected to terminal 15 by way of resistors R7, R8 and R9 respectively. Moreover, the base terminal of transistor T4 is connected to the collector terminal of transistor T3 and the base terminal of transistor T5 is connected to the collector terminal of transistor T4 by way of resistor R10.

The collector terminal of transistor T5 is connected to the cathode of the thyristor SCR2 and the gate of the thyristor is connected to the collector of transistor T4.

In use, when a positive pulse is applied to the base of transistor T3 through input terminal 17, transistors T3 and T5 will be turned on and transistor T4 turned off. In this condition of the circuit the gate of the thyristor is effectively connected to the positive terminal 15 by way of resistor R8 and the voltage initially applied to the gate is equal to the voltage at terminal 15 together with the voltage developed across resistor R8 due to the self inductive effect and the collapse of current therein. When the positive pulse is removed transistors T3 and T5 cease conducting and transistor T4 conducts. In this condition of the circuit the gate of the thyristor is negative with respect to the cathode and the thyristor will cease to conduct when the anode cathode current falls to zero.

To ensure reliability of operation in the case where two thyristors are connected in series, transistor T6 of p-n-p type is provided. The emitter is connected to terminal 15 and the collector to the cathode of the thyristor. The base of transistor T6 is supplied with a switching pulse to turn the transistor on when the firing circuit of the other thyristor receives a pulse to turn the latter thyristor on. In this manner the cathode of the thyristor SCR2 is effectively connected to terminal 15, and the gate is biased negative with respect to the cathode by substantially the voltage of the source of supply connected to terminals 15 and 16.

I claim:

1. A firing circuit for a thyristor comprising in combination, a source of d.c. supply, a resistor through which the gate of the thyristor is connected to the positive terminal of said supply, switch means closeable to connect said gate to the negative terminal of said supply, and to cause current flow from the supply through the resistor, said thyristor turning off when the anode cathode current flow through the thyristor falls to zero, and when the switch means is opened the voltage applied to the gate equaling the voltage of said positive terminal together with the voltage developed across the resistor due to the inductive effect of the resistor and means for determining the potential of the cathode of the thyristor so that when said switch means is closed the cathode of the thyristor will be positive with respect to the gate thereof.

2. A firing circuit as claimed in claim 1, in which said means for determining the cathode potential comprises a further switch means operable to connect the cathode to the positive terminal of the supply.

3. A firing circuit as claimed in claim 2, in which said switch means each comprise a transistor.

4. A firing circuit as claimed in claim 1, in which said means for determining the cathode potential comprises a diode through which the cathode of the thyristor is connected to the negative terminal of the supply.

5. A firing circuit as claimed in claim 4, including a further resistor for ensuring current flow through said diode, said further resistor being connected between the cathode of the thyristor and the positive terminal of the supply.

* * * * *